(12) United States Patent
Jovenin

(10) Patent No.: US 6,661,291 B2
(45) Date of Patent: Dec. 9, 2003

(54) FRACTIONAL AND RAPID RESPONSE FREQUENCY SYNTHESIZER, AND CORRESPONDING FREQUENCY SYNTHESIZING METHOD

(75) Inventor: Fabrice Jovenin, Caen (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/965,412

(22) Filed: Sep. 27, 2001

(65) Prior Publication Data

US 2002/0105387 A1 Aug. 8, 2002

(30) Foreign Application Priority Data

Sep. 29, 2000 (FR) .............................. 00 12459
Dec. 26, 2000 (FR) .............................. 00 17040

(51) Int. Cl.[7] ............................... H03L 7/00
(52) U.S. Cl. ..................... 331/1 A; 331/16; 331/17
(58) Field of Search ..................... 331/1 A, 16, 17, 331/18, 36 C, 177 V (56) References Cited

U.S. PATENT DOCUMENTS 5,739,730 A * 4/1998 Rotzoll ................... 331/177 V 6,262,609 B1 * 7/2001 Hafez et al. ................ 327/156

FOREIGN PATENT DOCUMENTS

JP           6104748      * 6/1994

* cited by examiner

Primary Examiner—Robert Pascal
Assistant Examiner—Kimberly E. Glenn
(74) Attorney, Agent, or Firm—Steven R. Biren

(57) ABSTRACT

The present invention relates a frequency synthesizer comprising in a phase-locked loop:
a phase-frequency comparator (16) connected to a reference frequency source (20),
at least a voltage-controlled oscillator (12) and
a fractional frequency divider (14) suitable for producing a mean dividing ratio having an integral component and a fractional component.

According to the invention, the oscillator comprises a plurality of oscillator stages which have different center frequencies, and the synthesizer further includes means for selecting an oscillator stage as a function of the integral component of the mean dividing ratio.

Application to portable telephones.

17 Claims, 3 Drawing Sheets

FRACTIONAL AND RAPID RESPONSE FREQUENCY SYNTHESIZER, AND CORRESPONDING FREQUENCY SYNTHESIZING METHOD

FIELD OF THE INVENTION

The present invention relates to a frequency synthesizer having a fractional divider and a corresponding frequency synthesizing method.

The invention more particularly relates to a frequency synthesizer permitting a precise adjustment of the frequency and capable of rapidly switching between various selected frequencies one after the other.

Such a frequency synthesizer may be used in various types of radio circuits and, more particularly, in receiving and/or transmitting stages of these circuits. By way of example the frequency synthesizer according to the invention may be used in cordless telephony equipment such as portable telephones.

BACKGROUND OF THE INVENTION

Figure 1:
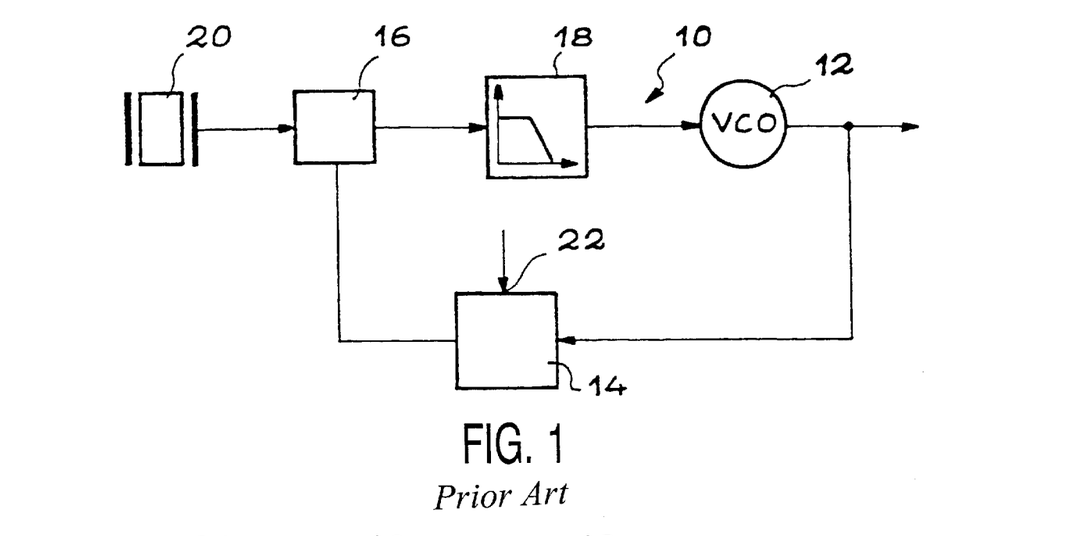
FIG. 1 already described, is a simplified basic circuit diagram of a known frequency synthesizer which has discrete frequency adjustment, FIG. 2, already described, is a simplified basic circuit diagram of a known frequency synthesizer which has continuous frequency adjustment.
Figure 2:
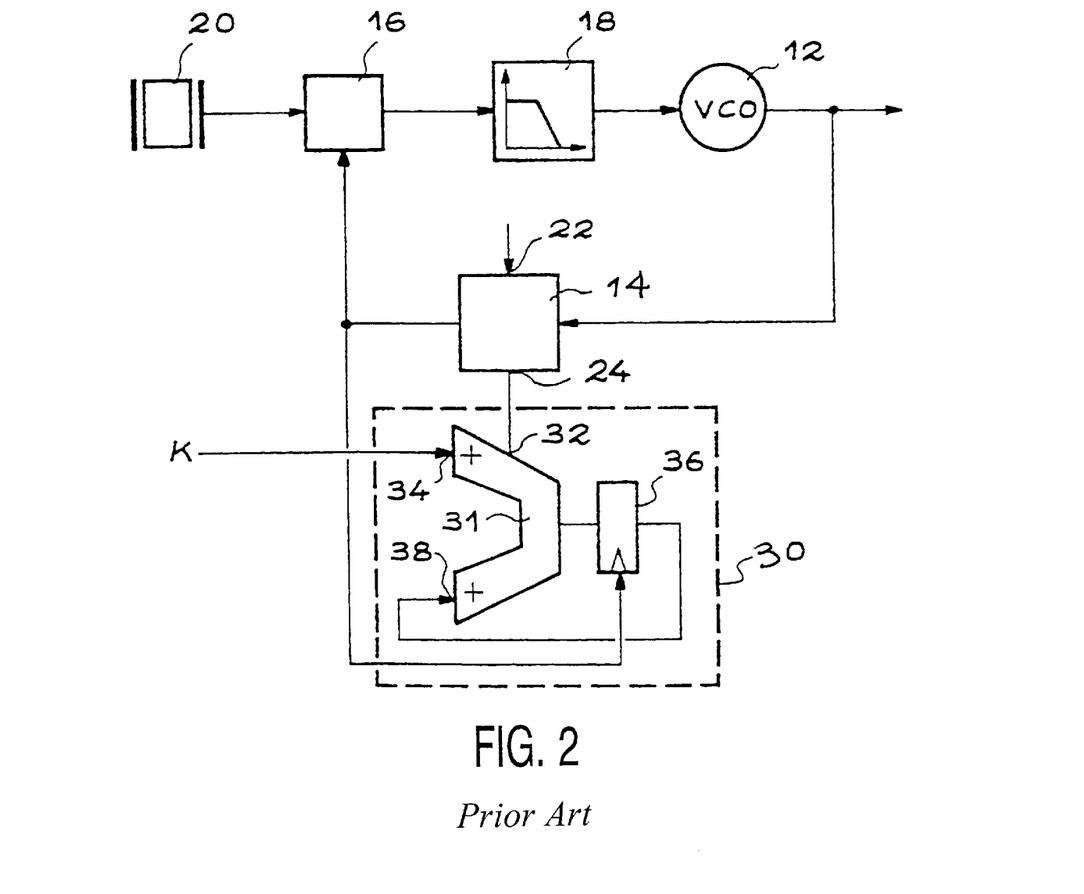

The appended FIGS. 1 and 2 illustrate an integral-value adjustable frequency synthesizer and a fractional-value adjustable frequency synthesizer. A fractional-value adjustable frequency synthesizer is understood to be a frequency synthesizer whose frequency can be adjusted by integral or non-integral multiples of a reference frequency. Such devices are known per se and illustrated, for example, by the documents (1), (2) and (3), whose complete references are stated at the end of the description.

FIG. 1 indicates the basic structure of a frequency synthesizer, which is constructed around a phase-locked loop 10. The phase-locked loop comprises, in essence, a voltage-controlled oscillator 12, a frequency divider 14, a phase-frequency comparator 16 and a loop filter 18.

The voltage-controlled oscillator 12, referred to as <<VCO oscillator>> in the following of the text, delivers an output signal whose frequency cannot be increased or reduced as a function of a control voltage applied to its input. This control voltage is produced by the phase-frequency comparator 16, which is connected to the input of the VCO oscillator 12 via the loop filter 18.

The phase-frequency comparator 16 compares the frequency (or phase) of a signal delivered by the frequency divider 14 and the frequency of a reference signal delivered in the example of the Figure by a quartz device 20. When the frequency of the signal delivered by the frequency divider is lower than that of the reference signal, the phase-frequency comparator associated to the loop filter 18 produces a voltage instructing the frequency of the VCO oscillator 12 to be increased. Conversely, the frequency of the VCO oscillator is reduced when the frequency of the signal delivered by the frequency divider is higher than that of the reference signal.

The frequency divider 14 is a device constructed around a certain number of flip-flops and can thus divide the frequency of the signal of the VCO oscillator 12 only by integral values. The dividing ratio, which is adjustable by integral values, is an integer referred to as N. An adjusting input, indicated by an arrow 22, enables to fix the value N.

The frequency of the VCO oscillator, referred to as $F_{VCO}$ is thus such that:

$$F_{VCO} = N * F_{ref} \quad (1)$$

where $F_{REF}$ is the frequency of the reference signal delivered by the quartz device 20.

It is observed that a modification by unity of the value of the dividing ratio N (integral) provokes a variation equal to $F_{ref}$ of the frequency of the VCO oscillator. Accordingly, it is impossible to adjust the frequency of the VCO oscillator 12 with a resolution higher than $F_{ref}$. In the case where the frequency of the reference signal is high, this resolution may turn out to be insufficient.

A much finer adjustment of the frequency of the output signal of the loop 10, that is to say, of the frequency of the signal delivered by the VCO oscillator 12, may be obtained with a frequency synthesizer in accordance with FIG. 2.

The frequency synthesizer shown in FIG. 2 comprises a phase-locked loop 10 which includes the same elements as those of loop 10 of FIG. 1.

The frequency divider 14, on the other hand, has not only an adjusting input 22 for fixing the value N of the dividing ratio, but also a switch input 24 for switching the dividing ratio between two or more consecutive values around the value N. In the example of FIG. 2, the switch input 24 of the frequency divider 14 enables to switch the dividing ratio between two values, which are N and N+1.

The switch input 24 is connected to a sigma-delta modulator 30 and, to be more precise, to an overflow-carry terminal 32 of this modulator.

The sigma-delta modulator 30 which, in the example of the Figure, is a first-order digital modulator with a word adder 31, has a first digital input 34 for an adjusting instruction referred to as K. The adjusting instruction is added to a digital value delivered by a shift register 36 of the modulator. The register 36 is clocked by the output signal of the frequency divider 14, and receives the output of the word adder 31. It is connected to a second digital input 38 of the adder. When the sum of the adjusting instruction and of the output of the register 36 is lower than a digital capacity of the adder 31, the overflow-carry adopts the logic 0 value, for example. On the other hand, when the sum is higher than the capacity of the adder 31, the overflow-carry adopts the complementary logic 1 value in that case.

The frequency divider 14 is arranged for performing a frequency division with a first dividing ratio when its switch input 24 receives the first logic state and for performing a division with a second dividing ratio which is different from +/−1, when the input 24 receives the second switching state.

In the example described, the dividing ratio is N for a logic 0 state and N+1 for a logic 1 state.

Although at any instant the dividing ratio of the frequency divider is an integer, the repeated switching of the ratio between N and N+1 enables to obtain a resulting mean dividing ratio comprised between these two values, that is to say, a non-integral ratio.

In a more precise way, one has:

$$F_{VCO} = \frac{1}{T_N + T_{N+1}}[T_N * N * F_{ref} + T_{N+1} * (N+1) * F_{ref}]$$

that is, $$F_{VCO} = \left[N + \frac{T_{N+1}}{T_N + T_{N+1}}\right] * F_{ref}$$

In these expressions, $T_N$ and $T_{N+1}$ are the periods during which the dividing ratio is equal to N and N+1, respectively.

Considering that the adjusting instruction K applied to the first input 34 of the sigma-delta modulator is coded in L bits, and that the maximum capacity of the adder is $2^L-1$, a fractional part of the dividing ratio equal to $K/2^L$ can be defined. The fractional component $K/2^L$ is further denoted k in the following of the text. One has:

$$F_{VCO} = \left[N + \frac{K}{2^L}\right] * F_{ref} \quad (2)$$

For low values of the adjusting instruction (K≅0) the output frequency is close to $F_{ref}*(N)$ and for high values of the adjusting instruction (K≅$2^L$) the output frequency is close to $F_{ref}*(N+1)$.

Accordingly, it is possible to continuously adjust the frequency of the phase-locked loop between two values fixed by the choice of the dividing ratio N applied to the adjusting input 22 of the frequency divider 14 and by the choice of the adjusting instruction K applied to the sigma-delta modulator.

In the conventional phase-locked loops shown in FIG. 1, the oscillation frequency of the voltage-controlled oscillator may be adjusted via frequency "steps" whose value is $F_{ref}$. The "step" thus corresponds to a variation of the dividing ratio from N to N+1 or from N to N−1. This clearly appears when reference is made to formula (1) indicated previously.

In order to obtain a relatively precise adjustment of the frequency of the loop, for example, the value of the frequency $F_{ref}$ of the reference signal is preferably chosen to be low. By way of a simple example, the frequency $F_{ref}$, and thus the adjusting step, may be of the order of 200 kHz.

It may also be observed that a low reference frequency leads to retaining high values N of the dividing ratio. Indeed, it would be recollected that the frequency of the voltage-controlled oscillator is the product of the reference frequency (relatively low) and the dividing ratio N (relatively high).

The constraint of the choice of a relatively low value for the reference frequency does not exist, however, in a phase-locked loop as shown in FIG. 2.

The formula (2) given earlier actually shows that it is possible to adjust the frequency by making the value of the fractional part k vary, that is to say $K/2^L$. The adjusting step may thus be that $F_{ref}/2^L$. For an 8 or 16-bit coding, that is to say, for L=8 or L=16, for example, the adjustment may be made nearly continuously and in a manner substantially independent of the reference frequency.

Thus, for phase-locked loops with a fractional divider, the reference frequency is preferably chosen to be very high. It is, for example, of the order of 26 MHz. A high frequency actually permits to correct the drifts of the loop in a finer way and thus permits a larger stability.

It may further be observed that the choice of a relatively high reference frequency permits to retain low values of N, that is to say, low values of the integral part of the dividing ratio.

The pulsation of its own of the phase-locked loop, denoted $\omega_n$, may be expressed as a function of the gain $K_{VCO}$ of the voltage-controlled oscillator 12, of the gain $K_\phi$ of a charge pump of the phase-frequency comparator 16, of the capacitance C of a capacitor of the loop filter 18 and of the integral part N of the dividing ratio of the divider 22. The relationship is the following:

$$\omega_n = \sqrt{\frac{K_{VCO} \cdot K_\phi}{N \cdot C}} \quad (3)$$

Also the switch time $t_s$ of the phase-locked loop depends on the value $\omega_n$ of the pulsation of the loop. The switch time $t_s$ may be understood to be the time necessary for the loop to be set at a given pulsation oscillation system or the time necessary for switching from one pulsation or frequency value to another.

The switch time $t_s$ is linked with the pulsation via the following relationship:

$$t_s = (2.5 \times 2 \times \pi)/\omega_n$$

By referring also to formula (3) of the pulsation $\omega_n$ indicated above, it is found that with an equal pulsation, relatively low values of the dividing ratio N, or at least all of its integral part, are to be compensated for by relatively high values of the capacitance C of the loop filter. Indeed, the values $K_{VCO}$ and $K_\phi$ are constant factors linked with the oscillator and with the charge pump of the phase-frequency comparator.

The choice of a high-value capacitor for the loop filter makes the influence of another time parameter t evident, which is the charge time of this capacitor. The loop filter may be considered a passband filter with a capacitor capable of converting a current i, not frequency filtered, of the charge pump of the phase frequency converter and a voltage $V_{tune}$, frequency filtered, and used for controlling the VCO oscillator. The charge time t of the capacitor C is linked with the current i and with the voltage $V_{tune}$ via the following relationship:

$$t = C \times V_{tune}/i \quad (4)$$

In this expression, C is the capacitance of the loop filter.

The charge time t of the capacitor will be added to the switch time $t_s$ previously mentioned and is likely to be unfavorable for the tuning speed of the loop at a desired frequency. This problem is specific of the loops which comprise a fractional divider, that is to say, loops controlled via a high reference frequency and having a low dividing ratio N.

The state of the art is further illustrated via documents whose references are stated at the end of the description.

DESCRIPTION OF THE INVENTION

It is an object of the invention to propose a frequency synthesizer and a corresponding method of frequency synthesis, which do not have the limitations recalled above.

It is more particularly an object of the invention to propose a frequency synthesizer of the type having a fractional divider, capable of operation with a high reference frequency and having a very brief overall switch time.

It is another object of the invention to propose such a synthesizer in which it is not necessary to resort to a multiplication of the number of charge pumps or to the overdimensioning of the charge pump providing the phase frequency converter with a phase-locked loop.

It is a further object of the invention to propose such a synthesizer which is to a large extent freed from the dispersion of characteristic features of the components and of the influence of thermal drifts.

To achieve these objects, the invention more precisely has for its object a frequency synthesizer comprising in a phase-locked loop:
- a phase-frequency comparator connected to a reference frequency source,
- at least a voltage-controlled oscillator, and
- a fractional frequency divider suitable for producing a mean dividing ratio with an integral part and a fractional part, the frequency divider being connected between the voltage-controlled oscillator and the phase-frequency comparator.

According to the invention the voltage-controlled oscillator comprises a plurality of oscillator stages which have different center frequencies, and the synthesizer comprises selection means for selecting an oscillator stage as a function of the integral part of the mean dividing ratio.

The invention is particularly applied to frequency synthesizers in which a frequency of a signal produced by the reference frequency source is higher and even very much higher than the frequency adjusting steps permitted by the frequency divider. This is the case for frequency synthesizers having a fractional divider.

By multiplying the number of VCO stages and selecting one of the stages, it is possible to assign to each stage a different center frequency and thus a different oscillation frequency band. These oscillation frequency bands, also called passbands, may thus be less wide than those of the complete oscillator or those of the oscillator of the prior art devices. While keeping the control voltage $V_{tune}$ unchanged, and by using this voltage for the control of oscillator stages that have narrower passbands, the gain $K_{VCO}$ of the various stages can be reduced. Indeed, the gain of an VCO oscillator or of a stage of an VCO oscillator is understood to be the ratio between the variation of the frequency and that of the control voltage ($V_{tune}$).

While reference is made to equation (3) of the pulsation of the phase-locked loop given in the introductory part of the text, it is found that a reduction of the gain $K_{VCO}$ permits with an equal pulsing value, a reduction of the value of the capacitance C of the loop filter. A capacitance C that is lower permits to reduce the charge time t. For this subject one may be referred to equation (4) also given in the introductory part.

While reference is still made to this same formula, it is observed that an increase of the current i would also have led to a reduction of the charge time t. On the other hand, this other solution, not retained by the invention, would have required a new concept of the charge pump of the phase frequency comparator to augment the intensity of the current i which it delivers.

It may further be observed that the various stages of the voltage-controlled oscillator have very brief switch times, not only because of their limited gain, but also because the frequency of the signal which they may deliver is generally closer to their center frequency which would not be the case with a single-stage oscillator.

Although this is not an absolutely necessary condition for the functioning of the synthesizer, it is, however, desirable that the passbands of the voltage-controlled oscillator stages are consecutive and pair-wise overlap.

The voltage-controlled oscillator may comprise a single VCO oscillator associated to a bank of capacitors or varactors used for the selection of the center frequency. A varactor is understood to be a component whose capacitance may be adjusted by a control voltage. Each capacitor or varactor thus forms with the VCO oscillator one of the oscillator stages. According to a variant, the voltage-controlled oscillator may also comprise a plurality of autonomous oscillators VCO which have, respectively, different center frequencies and form the various respective stages. The frequencies may in this case also be fixed by capacitors associated to the various VCOs.

In a particular embodiment of the synthesizer according to the invention, the selection means of the oscillator stages may comprise a logic table linking the respective integral parts of the dividing ratio selected for the frequency divider with choices of stages of the voltage-controlled oscillator.

The selection means may also comprise a logic pointer controlled by a data that corresponds to the integral part of the dividing ratio, to select a stage of the voltage-controlled oscillator on the basis of the logic table.

The logic table may comprise logic values, for example, in the form of binary codes, associated to values of N, and which may be used for controlling the opening or closing of switches. The switches are thus provided either for switching one of the stages formed of an autonomous VCO in the phase-locked loop, or for selecting one or various capacitors of a capacitor bank for modifying the center frequency of a VCO. The binary codes may also be used for a varactor voltage control.

According to a perfected embodiment of the synthesizer according to the invention, this synthesizer may comprise calibration means associated to the selection means of the stages of the voltage-controlled oscillator. Thanks to the calibration, the synthesizer may be freed from the scatterings of the characteristics of the VCO oscillator, which may result from the manufacture of its components or from their sensitivity to temperature. The calibration may take place when the device is turned on or possibly with each change of frequency. The calibration means may comprise, for example, a first and a second counter clocked by the voltage-controlled oscillator and by the reference frequency source, respectively, a subtracter connected to the counters for establishing a counting difference, and means for correcting the selection as a function of the counting difference.

The use of two counters is a particularly economic and reliable solution for controlling the frequency of the stages of the VCO. It further permits to establish directly a correction instruction which the counting difference is.

To take the correction instruction into account, the calibration means may comprise an adder for adding the counting difference to the integral value of the mean dividing ratio N and for applying this sum to the logic selection table of the stages of the voltage-controlled oscillator. The calibration means may also comprise a shift register of the digital selection values of the stages of the voltage-controlled oscillator, written in the logic selection table.

The invention also relates to a method of synthesizing frequencies by means of a frequency synthesizer, comprising in a phase-locked loop:
a phase-frequency comparator connected to a reference frequency source,
at least a voltage-controlled oscillator, and
a fractional frequency divider suitable for producing a mean dividing ratio with an integral part and a fractional part, the frequency divider being connected between the voltage-controlled oscillator and the phase-frequency comparator,
in which the voltage-controlled oscillator comprises a plurality of oscillator stages which have different center frequencies. According to the method, one of the stages of the voltage-controlled oscillator is selected as a function of the integral value of the mean dividing ratio.

Finally, the invention relates to a frequency converter equipped with the frequency synthesizer according to the invention, and its use in a portable telephone.

Other characteristic features and advantages of the invention pertain to the description that will follow, and have reference to the appended drawing Figures. This description is given in a purely illustrative and non-limitative capacity.

switches and the selected oscillator stage. The stages are indicated by $VCO_0$ to $VCO_6$, which corresponds to 7 voltage-controlled oscillators. The Table further indicates the frequency ranges of the oscillation of the various stages when the control voltage, that is to say $V_{tune}$ varies from 0.4 to 3.8 volts. The frequencies are expressed in megahertz. The control voltage delivered by the loop filter generally varies from 0 to 4 volts, but, as in this example, may be limited to a much smaller range. The Table I does not exactly correspond to the FIG. 3 on which only five oscillator stages are shown for clarity.

TABLE I

| N | <8 | 9 à 14 | 11 à 17 | 14 à 20 | 18 à 23 | 21 à 27 | >28 |
|---|---|---|---|---|---|---|---|
| instruction | "0000,00" | "0000,01" | "0001,01" | "0011,01" | "0111,01" | "1111,01" | "1111,11" |
| freq@0.4 V | 1.757 | 1.787 | 1.817 | 1.858 | 1.893 | 1.939 | |
| Freq@3.8 V | | 1.842 | 1.876 | 1.921 | 1.960 | 2.012 | 2.069 |
| stage | $VCO_0$ | $VCO_1$ | $VCO_2$ | $VCO_3$ | $VCO_4$ | $VCO_5$ | $VCO_6$ |

DETAILED DESCRIPTION OF EMBODIMENTS OF THE INVENTION

In the following description, parts of the FIGS. 3, 4 and 5 which are identical, similar or equivalent to parts of the Figures already described are referred to by like digital references. One may thus with respect thereto refer to the preceding description with reference to the FIGS. 1 and 2.

Figure 3:
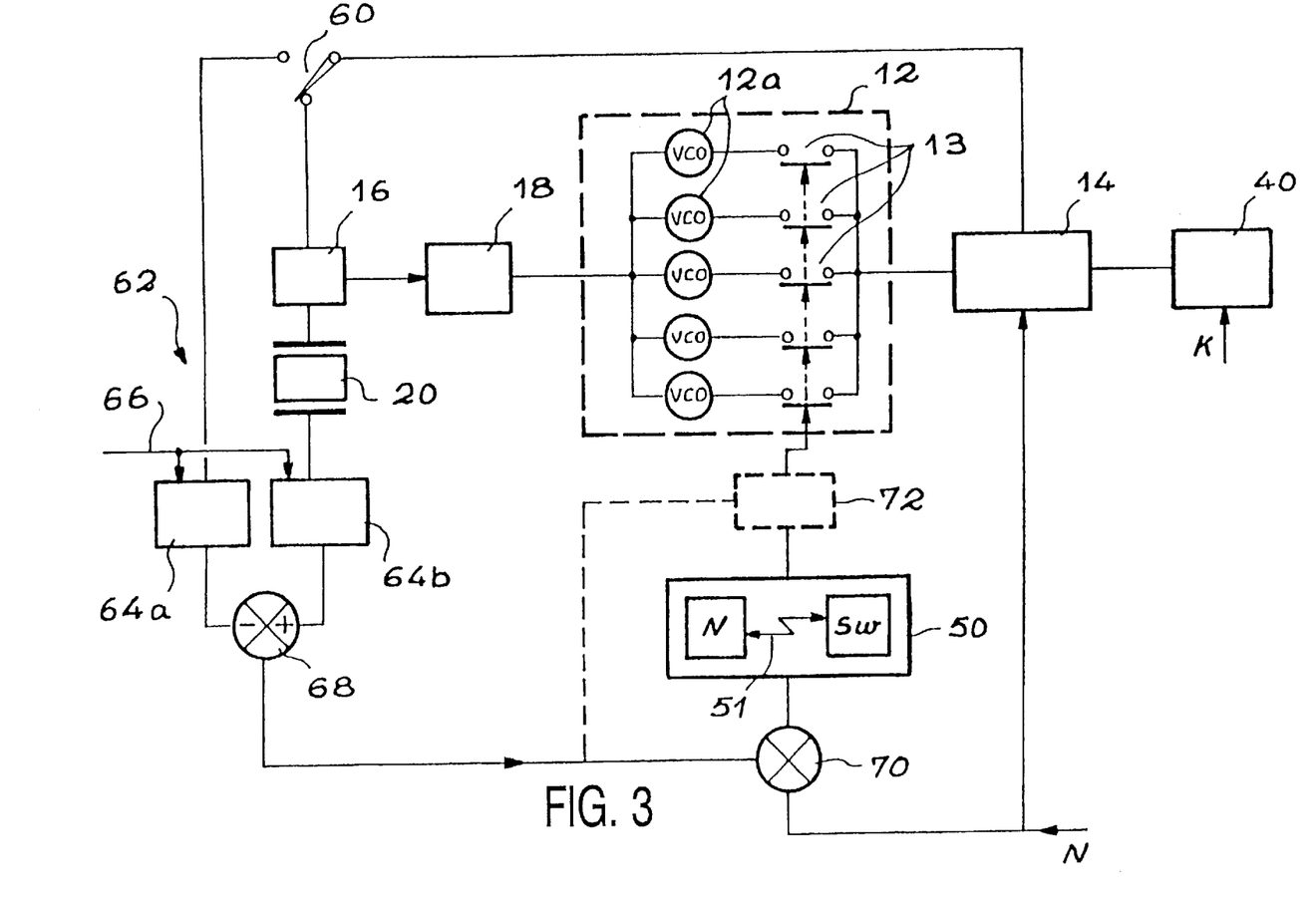
FIG. 3 is a simplified diagram of a frequency synthesizer according to the invention.

The single-stage oscillator of FIGS. 1 and 2 is replaced in FIG. 3 by a voltage-controlled oscillator 12 which has a plurality of oscillator stages. Each stage comprises an autonomous 12a VCO oscillator. These autonomous oscillators are connected in parallel between the loop filter 18 and the frequency divider 14. Each stage comprises, for that matter, a switch 13 capable of turning the oscillator 12a on and off. Turning the switches on is controlled by selection means described earlier. They permit to select a single oscillator 12a at a time.

In the example described, each oscillator 12a has a passband and a center frequency of its own. A passband is understood to be the range of frequencies which the oscillator 12a of the type VCO can deliver by making the control voltage delivered by the phase-frequency comparator and the loop filter vary from a minimum value to a maximum value. The center frequency is the middle frequency of the band obtained by applying about half the maximum voltage as a control voltage. Furthermore, the center frequencies of the oscillators of the various stages have an arithmetical progression and the passbands show an overlap.

As indicated in the introductory part, the two control parameters which are essential to the frequency synthesizer are the integral part N of the dividing ratio and the fractional part which is controlled by an adjusting instruction K applied to the sigma-delta modulator 40.

The value N is directly applied to the frequency divider 14, but also to a logic table 50. A pointer 51 of the logic table permits to select a digital control instruction of the switches 13 as a function of the value N.

The Table I below gives an example of correspondence between the values N, the logic control instruction of the Similarly, the Table I does not exactly correspond to the contents of the table of correspondence 50. Indeed, it may be observed that various oscillator stages may correspond to certain values of N. This overlap, which is also translated by an overlap of the frequency ranges that may be generated by the oscillator stages, permits to compensate for a drift of characteristics of the oscillator stages during a correction examined later. When two oscillator stages can produce a same oscillation frequency in response to a value N, the table of correspondence 50 may be programmed, for example, to retain the stage for which the frequency in question is closest to the center frequency.

The table of correspondence may comprise a memory ROM (read-only memory), programmed during manufacture or, possibly, a programmable memory of the EPROM type.

In normal operation of the frequency synthesis, the output of the frequency divider is connected to the input of the phase-frequency comparator 16. However, a switch 60 permits to send the frequency-divided signal to a calibration stage 62 when the switch 60 is being turned on or even each time the value N of the integral part of the dividing ratio is being modified.

The calibration stage comprises two substantially identical counters 64a and 64b. The first counter 64a is connected, via the switch 60, to the output of the frequency divider 14. The second counter 64b, on the other hand, is directly connected to the quartz crystal of the reference frequency source 20. A synchronization command 66 permits to simultaneously start and end the counting of the two counters 64a and 64b.

In principle, when the oscillation stages are calibrated perfectly well and when they oscillate at the frequency selected by the choice of N, no difference should exist between the result of the count of the two counters. Indeed, if $F_{vco}$, the oscillation frequency of the selected oscillator stage, is such that $F_{vco}=F_{ref}*N$, one would have to obtain on the output of the divider, that is to say on the input of the first counter, a frequency $F_{vco}/N$ or $F_{ref}$, which is the frequency of the reference frequency source. It should be considered here that during a calibration phase a fractional component k is kept zero.

On the other hand, if there is a counting difference between the two counters, a correction can be made. A difference Mb−Ma is established by a subtracter 68, connected to the outputs of the two counters 64*a* and 64*b*. Ma and Mb indicate here the counting values of the two counters obtained during a counting period Δt separating the commands of synchronization of the start and the end of the counting.

In the example described the minimum error between the sum obtained via the two counters is 1, which corresponds to a frequency error of one time the value of the reference frequency $F_{ref}$. In other words, one has:

$$F_{VCO}=(N+\Delta N)*F_{ref}$$

where ΔN is the frequency error of the oscillator related to a variation of the dividing ratio. One may also write:

$$Min|Mb-Ma|=\Delta t*Fref/N*Min(\Delta N).$$

In this expression Min indicates the minimum.

The value of Min(ΔN), which is not necessarily an integer, may preferably be chosen as a function of the importance of the overlap between the frequency ranges and thus the ranges of dividing ratios associated to the various oscillator stages. On the choice of ΔN also depends the choice of Δt.

In the example described here ΔN is chosen to equal 1 and thus Δt=$F_{ref}$/N (with Min|Mb−Ma|=1).

The time Δt is short compared to the times t and $t_s$ indicated in the introductory part of the description. By way of simple example one may have Δt=20 μsec for $t_s$=100 μsec and t=1000 μsec.

The subtracter 68 is connected to an adder 70 provided at the input of the logic table 50 to add to the selection of the value N the difference Mb−Ma. This permits to take the counting error into account for the selection of the oscillator stage. It should be observed that the value N applied to the divider 14 is kept unchanged.

According to another possibility, represented in a broken line, the correction linked with the counting difference may also be taken into account as an alternative at the output of the table 50. In that case, however, the counting difference is to be translated into a modification of the logic command instructions ($S_w$) of the switches. This operation is executed via a register 72.

At the end of the calibration phase a new switching of the switch 60 permits to close the loop again until a new value of N or a value N likely to modify the choice of the oscillator stage VCO is selected.

Figure 4:
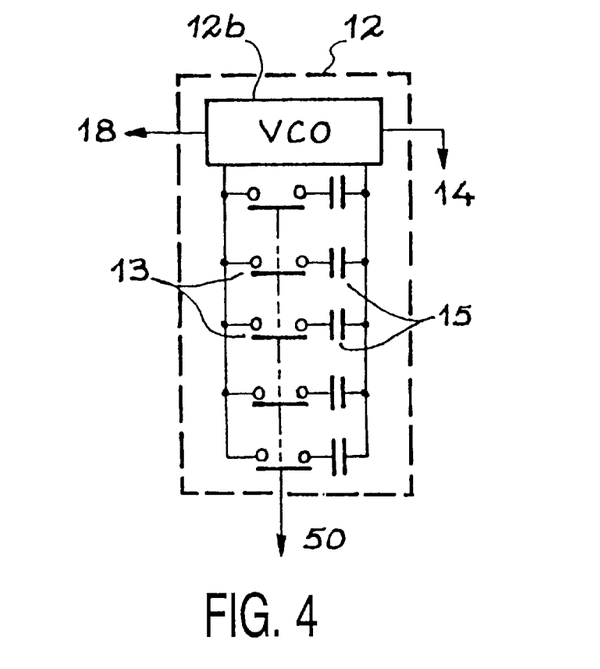
FIG. 4 is a simplified diagrammatic representation of a voltage controlled oscillator which can be used in a frequency synthesizer according to the invention and forms a variant of an oscillator used in the device shown in FIG. 3.

FIG. 4 briefly described hereinafter shows another possibility of realizing the voltage-controlled oscillator 12. In the example of this Figure, a single VCO oscillator 12*b* (voltage-controlled) is connected to a bank of capacitors 15, which are connected in parallel. The capacitors 15, provided for choosing the center frequency and the oscillation frequency band of the single oscillator, are connected in series to the switches 13. The opening and closing of these switches is controlled by logic codes established in a table of correspondence of the same type as that described with respect to FIG. 3. However, it may be observed that, different from the previous embodiment, various switches may be closed simultaneously.

It should be pointed out that each switch associated to a capacitor may correspond to a varactor line. The closing and opening of the switch then symbolizes the application or not of a control voltage to the input of the varactor.

Figure 5:
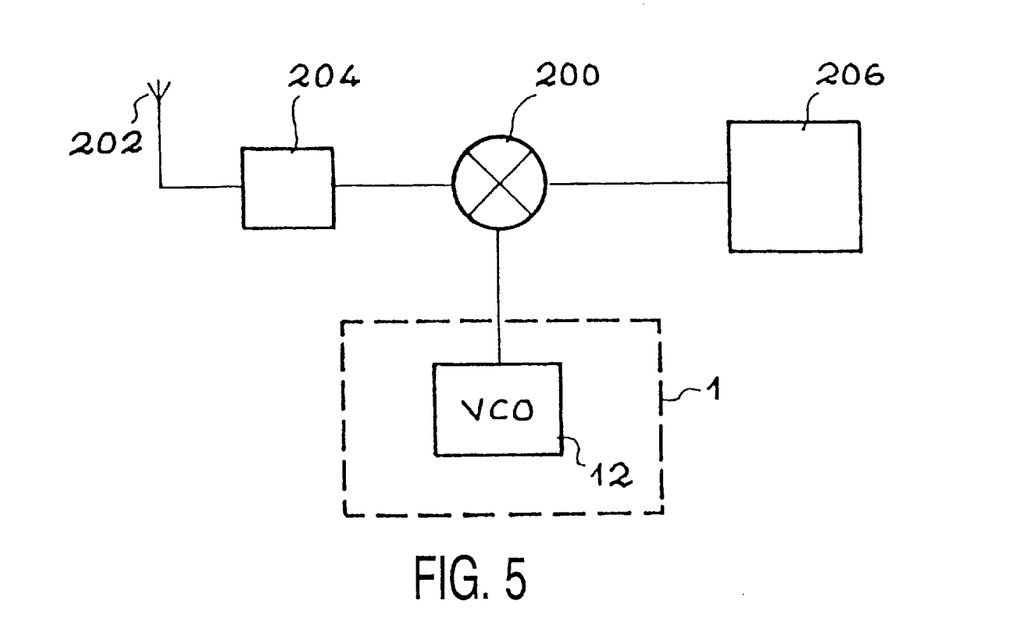
FIG. 5 is a simplified diagrammatic representation of a frequency converter utilizing a frequency synthesizer according to with the invention.

FIG. 5 shows an application of a frequency synthesizer according to the invention for the realization of a frequency converter and, more precisely, of a frequency converter in a signal transceiver.

The converter comprises a mixer to which is connected, on the one hand, a signal source to be converted, for example, an antenna 202 associated to a filter 204 and, on the other hand, a processing unit 206. The processing unit 206 receives the signal whose frequency is converted. This is, for example, a processing unit of a portable telephone.

The mixer 200 also receives a reference frequency signal of a second signal source which, in the described example, comes from an VCO oscillator 12 of a frequency synthesizer 1 in accordance with the invention.

Cited Documents:
(1) EP-B-0 661 816
(2) EP-A-0 563 400
(3) "Fractional-N P11 using delta-sigma modulation" by Thomas Stichelbout, Aalborg University, Aug. 5, 1997, pages 1 to 21.
(4) WO 89/06456
(5) EP-A-0 910 170
(6) EP-A-0 664 616
(7) EP-A-0 944 171
(8) U.S. Pat. No. 5,053,723
(9) U.S. Pat. No. 5,648,744

What is claimed is:

1. A frequency synthesizer comprising in a phase-locked loop:
   a phase-frequency comparator (16) connected to a reference frequency source (20),
   at least a voltage-controlled oscillator (12) and
   a fractional frequency divider (14) suitable for producing a mean dividing ratio having an integral component and a fractional component, the frequency divider being connected between the voltage-controlled oscillator (12) and the phase-frequency comparator (16),
   characterized in that the voltage-controlled oscillator comprises a plurality of oscillator stages which have different center frequencies, in that the synthesizer further includes means for selecting (13, 50) an oscillator stage, and in that the center frequencies of the voltage-controlled oscillator stages conform to an arithmetical progression and a calibration means comprise a first and a second counter (64*a*, 64*b*), clocked by the voltage-controlled oscillator (12) associated to the frequency divider (14) and by the reference frequency source (20), respectively, a subtracter (68) connected to the counters for establishing a counting difference, and means (70, 72) for correcting a selection as a function of the counting difference.

2. A synthesizer as claimed in claim 1, in which a correction means comprise an adder (70) for adding the counting difference to the integral value of the means dividing ratio and for applying this sum to a selection pointer (51) of a logic table (50) for selecting stages of the voltage-controlled oscillator.

3. A frequency synthesizer as claimed in claim 1, in which the correction means comprise a shift register (70) for digital selection values of a stage of the voltage-controlled oscillator read from a logic selection table (50).

4. A method of synthesizing frequencies by means of a frequency synthesizer, comprising in a phase-locked loop:
   a phase-frequency comparator (16) connected to a reference frequency source (20),
   at least a voltage-controlled oscillator (12),
   a fractional frequency divider (14) suitable for producing a mean dividing ratio having an integral component and a fractional component, the frequency divider being connected between the voltage-controlled oscillator and the phase-frequency comparator, in which the voltage controlled oscillator comprises a plurality of oscillator stages having different center frequencies, means for selecting (13, 50) an oscillator stage, characterized in that said method comprising a calibration step of the selection during which the phase-locked loop is open, and a frequency synthesizing step during which the phase-locked loop is closed.

5. A method as claimed in claim 4, comprising a calibration step when the frequency synthesizer is turned on.

6. A method as claimed in claim 4, further including a calibration step each time a new selection of a dividing ratio is made.

7. A frequency synthesizer comprising in a phase-locked loop:

a phase-frequency comparator (16) connected to a reference frequency source (20), at least a voltage-controlled oscillator (12) and a fractional frequency divider (14) suitable for producing a mean dividing ratio having an integral component and a fractional component, the frequency divider being connected between the voltage-controlled oscillator (12) and the phase-frequency comparator (16), characterized in that the voltage-controlled oscillator comprises a plurality of oscillator stages which have different center frequencies, in that the synthesizer further includes means for selecting (13, 50) an oscillator stage as a function of the integral component of the mean dividing ratio, in that the selection means comprise a logic table (50) connecting, respectively, the integral parts of the dividing ratio of the frequency divider to selections of stages of the voltage-controlled oscillator, and in that the selection means comprise a logic pointer (51) controlled by a data corresponding to the integral part of the dividing ratio, and associated to the logic table for selecting a stage of the voltage-controlled oscillator.

8. A frequency synthesizer comprising in a phase-locked loop:

a phase-frequency comparator (16) connected to a reference frequency source (20), at least a voltage-controlled oscillator (12) and a fractional frequency divider (14) suitable for producing a mean dividing ratio having an integral component and a fractional component, the frequency divider being connected between the voltage-controlled oscillator (12) and the phase-frequency comparator (16), characterized in that the voltage-controlled oscillator comprises a plurality of oscillator stages which have different center frequencies, in that the synthesizer further includes means for selecting (13, 50) an oscillator stage as a function of the integral component of the mean dividing ratio, and in that the center frequencies of the voltage-controlled oscillator stages conform to an arithmetical progression and in which a calibration means comprise a first and a second counter (64a, 64b), clocked by the voltage-controlled oscillator (12) associated to the frequency divider (14) and by the reference frequency source (20), respectively, a subtracter (68) connected to the counters for establishing a counting difference, and means (70, 72) for correcting a selection as a function of the counting difference.

9. A synthesizer as claimed in claim 8, in which a correction means comprise an adder (70) for adding the counting difference to the integral value of the mean dividing ratio and for applying this sum to a selection pointer (51) of a logic table (50) for selecting stages of the voltage-controlled oscillator.

10. A synthesizer as claimed in claim 8, in which the correction means comprise a shift register (70) for digital selection values of a stage of the voltage-controlled oscillator read from a logic selection table (50).

11. A method of synthesizing frequencies by means of a frequency synthesizer, comprising in a phase-locked loop:

a phase-frequency comparator (16) connected to a reference frequency source (20), at least a voltage-controlled oscillator (12), a fractional frequency divider (14) suitable for producing a mean dividing ratio having an integral component and a fractional component, the frequency divider being connected between the voltage-controlled oscillator and the phase-frequency comparator, in which the voltage controlled oscillator comprises a plurality of oscillator stages having different center frequencies, and in which one of the stages of the voltage-controlled oscillator is selected as a function of the integral value of the mean dividing ratio of the frequency divider, wherein said method comprises a calibration step of the selection during which the phase-locked loop is open, and a frequency synthesizing step during which the phase-locked loop is closed.

12. A method as claimed in claim 11, comprising a calibration step when the frequency synthesizer is turned on.

13. A method as claimed in claim 11, further including a calibration step each time a new selection of a dividing ratio is made.

14. A frequency converter comprising a mixer (200) which has a first input connected to a first signal source (202, 204) delivering a signal that has a frequency to be converted, and comprising a second signal source (1) which has a reference frequency, the second source being connected to a second mixer input, wherein the second signal source (1) having a reference comprises a frequency synthesizer (12) comprising in a phase-locked loop:

a phase-frequency comparator (16) connected to a reference frequency source (20), at least a voltage-controlled oscillator (12) and a fractional frequency divider (14) suitable for producing a mean dividing ratio having an integral component and a fractional component, the frequency divider being connected between the voltage-controlled oscillator (12) and the phase-frequency comparator (16), characterized in that the voltage-controlled oscillator comprises a plurality of oscillator stages which have different center frequencies, in that the synthesizer further includes means for selecting (13, 50) an oscillator stage as a function of the integral component of the mean dividing ratio, in that the selection means comprise a logic table (50) connecting, respectively, the integral parts of the dividing ratio of the frequency divider to selections of stages of the voltage-controlled oscillator, and in that the selection means comprise a logic pointer (51) controlled by a data corresponding to the integral part of the dividing ratio, and associated to the logic table for selecting a stage of the voltage-controlled oscillator.

15. A portable telephone comprising a frequency converter having a mixer (200) which has a first input connected to a first signal source (202, 204) delivering a signal that has a frequency to be converted, and a second signal source (1) which has a reference frequency, the second source being connected to a second mixer input, wherein the second signal source (1) having a reference comprises a frequency synthesizer (12) comprising in a phase-locked loop:

a phase-frequency comparator (16) connected to a reference frequency source (20), at least a voltage-controlled oscillator (12) and a fractional frequency divider (14) suitable for producing a mean dividing ratio having an integral component and a fractional component, the frequency divider being connected between the voltage-controlled oscillator (12) and the phase-frequency comparator (16), characterized in that the voltage-controlled oscillator comprises a plurality of oscillator stages which have different center frequencies, in that the synthesizer further includes means for selecting (13, 50) an oscillator stage as a function of the integral component of the mean dividing ratio, in that the selection means comprise a logic table (50) connecting, respectively, the integral parts of the dividing ratio of the frequency divider to selections of stages of the voltage-controlled oscillator, and in that the selection means comprise a logic pointer (51) controlled by a data corresponding to the integral part of the dividing ratio, and associated to the logic table for selecting a stage of the voltage-controlled oscillator.

16. A frequency synthesizer comprising in a phase-locked loop:

a phase-frequency comparator (16) connected to a reference frequency source (20), at least a voltage-controlled oscillator (12) and a fractional frequency divider (14) suitable for producing a mean dividing ratio having an integral component and a fractional component, the frequency divider being connected between the voltage-controlled oscillator (12) and the phase-frequency comparator (16), characterized in that the voltage-controlled oscillator comprises a plurality of oscillator stages which have different center frequencies, in that the synthesizer further includes means for selecting (13, 50) an oscillator stage, in that a frequency of a signal produced by the reference frequency source is higher than a frequency adjusting step of the frequency divider, in that the selection means comprise a logic table (50) connecting, respectively, the integral parts of the dividing ratio of the frequency divider to selections of stages of the voltage-controlled oscillator, and in that the selection means comprise a logic pointer (51) controlled by a data corresponding to the integral part of the dividing ratio, and associated to the logic table for selecting a stage of the voltage-controlled oscillator.

17. A frequency synthesizer comprising in a phase-locked loop:

a phase-frequency comparator (16) connected to a reference frequency source (20), at least a voltage-controlled oscillator (12) and a fractional frequency divider (14) suitable for producing a mean dividing ratio having an integral component and a fractional component, the frequency divider being connected between the voltage-controlled oscillator (12) and the phase-frequency comparator (16), characterized in that the voltage-controlled oscillator comprises a plurality of oscillator stages which have different center frequencies, in that the synthesizer further includes means for selecting (13, 50) an oscillator stage, in that a frequency of a signal produced by the reference frequency source is higher than a frequency adjusting step of the frequency divider, and in that the center frequencies of the voltage-controlled oscillator stages conform to an arithmetical progression and in which a calibration means comprise a first and a second counter (64a, 64b), clocked by the voltage-controlled oscillator (12) associated to the frequency divider (14) and by the reference frequency source (20), respectively, a subtracter (68) connected to the counters for establishing a counting difference, and means (70, 72) for correcting a selection as a function of the counting difference.

* * * * *